(12) United States Patent
Yoon et al.

(10) Patent No.: US 7,791,391 B2
(45) Date of Patent: Sep. 7, 2010

(54) QUADRATURE PHASE CORRECTION CIRCUIT

(75) Inventors: Dae-Kun Yoon, Gyeonggi-do (KR);
Dae-Han Kwon, Gyeonggi-do (KR);
Taek-Sang Song, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 55 days.

(21) Appl. No.: 12/215,829

(22) Filed: Jun. 30, 2008

(65) Prior Publication Data

US 2009/0256610 A1 Oct. 15, 2009

(30) Foreign Application Priority Data

Apr. 11, 2008 (KR) ........................ 10-2008-0033774

(51) Int. Cl.
*H03K 5/13* (2006.01)
(52) U.S. Cl. ........................ 327/254; 327/255; 327/238
(58) Field of Classification Search .................. 327/31, 327/35, 175, 254, 255, 238, 241–245
See application file for complete search history.

(56) References Cited

U.S. PATENT DOCUMENTS 5,367,200 A * 11/1994 Leonida ........................ 327/33

FOREIGN PATENT DOCUMENTS

KR 100763849 B1 9/2007

* cited by examiner

*Primary Examiner*—An T Luu
(74) *Attorney, Agent, or Firm*—Blakely, Sokoloff, Taylor & Zafman

(57) ABSTRACT

A quadrature phase correction circuit includes an N-bit code counter configured to generate an N-bit code value according to a detected phase difference when a quadrature phase correction is carried out, N-bit code values are stored according to a plurality of detected phase differences. A controller shares the N-bit code counter, controls the generation of the N-bit code values according to the plurality of detected phase differences, and controls the storing of the N-bit code values in an allocated space of the storage by use of a multiplexer configured to provide the plurality of detected phase differences to the N-bit code counter, and a demultiplexer configured to store the N-bit code values in the allocated space of the storage.

17 Claims, 4 Drawing Sheets

QUADRATURE PHASE CORRECTION CIRCUIT

CROSS-REFERENCE TO RELATED APPLICATIONS

The present invention claims priority of Korean patent application number 2008-0033774, filed on Apr. 11, 2008, which is incorporated by reference in its entirety.

BACKGROUND OF THE INVENTION

The present invention relates to a quadrature phase correction circuit, and more particularly, to a quadrature phase correction circuit that can reduce a layout size by decreasing the number of code counters.

Synchronous semiconductor devices input and output data in synchronization with a clock signal. Such synchronous semiconductor devices include clock signal generators for generating an internal clock signal synchronized with an external clock signal. One of the clock signal generators is a quadrature phase signal generator to generate a quadrature phase clock signal having a 90-degree phase difference from an external clock.

FIG. 1 is a block diagram of a conventional quadrature phase correction circuit.

Referring to FIG. 1, the conventional quadrature phase correction circuit includes a quadrature phase correction (QPC) controller 10, a phase detection circuit 12, a duty cycle correction circuit 14, and a phase error correction circuit 16. The phase detection circuit 12 detects phases of in-phase (I) and quadrature (Q) clock signals fed back. The duty cycle correction circuit 14 performs a duty cycle correction on an external I-clock signal and an external Q-clock signal according to the phase difference detected by the phase detection circuit 12. The phase error correction circuit 16 corrects the phase error of an I-clock signal ICLK_DC and the Q-clock signal QCLK_DC whose duty cycles are corrected by the duty cycle correction circuit 14.

The phase detection circuit 12 includes an N-bit code counter 24, an initial code control (ICC) circuit 22, and a phase detector (I-DCD(I-IB)) 20. The N-bit code counter 24 sets and stores code values for correction according to the I-clock signal and offset values of components in an initial operation. The ICC circuit 22 performs an initial code control according to the code values set in the code counter 24. The phase detector 20 receives the I-clock signal ICLK_DC and the IB-clock signal IBCLK_DC fed back after the offset value is adjusted by the ICC circuit 22, and generates a high signal or a low signal according to the phase detection. The IB-clock signal IBCLK_DC represents an inversion signal of the I-clock signal ICLK_DC.

The phase detector 20 compares a phase of the I-clock signal with a phase of the IB-clock signal when a strobe signal (not shown) applied from a quadrature phase correction (QPC) controller 10 is at a high level or a low level. The phase detector 20 generates the high signal when the phase of the I-clock signal ICLK_DC is greater than that of the IB-clock signal IBCLK_DC, and generates the low signal when the phase of the I-clock signal ICLK_DC is less than that of the IB-clock signal IBCLK_DC.

In addition, the phase detection circuit 12 includes an N-bit code counter 30, an ICC circuit 28, and a phase detector (Q-DCD(Q-QB)) 26. The N-bit code counter 30 sets and stores code values for correction according to the Q-clock signal and offset values of components in an initial operation. The ICC circuit 28 performs an initial code control according to the code values set in the code counter 30. The phase detector 26 receives the Q-clock signal QCLK_DC and the QB-clock signal QBCLK_DC fed back after the offset value is adjusted by the ICC circuit 28, and generates a high signal or a low signal according to the phase detection. The QB-clock signal QBCLK_DC represents an inversion signal of the Q-clock signal QCLK_DC.

The phase detector 26 compares a phase of the Q-clock signal with a phase of the QB-clock signal when a strobe signal (not shown) applied from the QPC controller 10 is at a high level or a low level. The phase detector 26 generates the high signal when the phase of the Q-clock signal QCLK_DC is greater than that of the QB-clock signal QBCLK_DC, and generates the low signal when the phase of the Q-clock signal QCLK_DC is less than that of the QB-clock signal QBCLK_DC.

Furthermore, the phase detection circuit 12 includes an N-bit code counter 36, an ICC circuit 34, and a phase detector (QPD(I-Q)) 32. The N-bit code counter 36 sets and stores code values for correction according to the I-clock signal and the Q-clock signal, whose duty cycles are corrected, and offset values of components. The ICC circuit 34 performs an initial code control according to the code values set in the code counter 36. The phase detector 32 receives the I-clock signal ICLK_PC and the Q-clock signal QCLK_PC fed back after the offset value is adjusted by the ICC circuit 34, and generates a high signal or a low signal according to the phase detection.

The phase detector 32 compares a phase of the I-clock signal ICLK_PC with a phase of the Q-clock signal QCLK_PC when a strobe signal (not shown) applied from the QPC controller 10 is at a high level or a low level. The phase detector 32 generates the high signal when the phase of the I-clock signal ICLK_PC is greater than that of the Q-clock signal QCLK_PC, and generates the low signal when the phase of the I-clock signal ICLK_PC is less than that of the Q-clock signal QCLK_PC.

The duty cycle correction circuit 14 includes an N-bit code counter 40 and an I-IB duty cycle correction circuit 42. The N-bit code counter 40 sets code values by increasing or decreasing the code values according to the high/low value detected by the phase detector 20. The I-IB duty cycle correction circuit 42 corrects the duty cycles of the I-clock signal ICLK_E and the IB-clock signal IBCLK_E according to the code values set by the N-bit code counter 40. The I-clock signal ICLK_DC and the IB-clock signal IBCLK_DC, whose duty cycles are corrected by the I-IB duty cycle correction circuit 42, are fed back to the phase detector 20. The I-clock signal ICLK_E and the IB-clock signal IBCLK_E input to the I-IB duty cycle correction circuit 42 are clock signals that are generated using an external reference clock signal by a clock generator (not shown).

In addition, the duty cycle correction circuit 14 includes an N-bit code counter 44 and a Q-QB duty cycle correction circuit 46. The N-bit code counter 44 sets code values by increasing or decreasing the code values according to the high/low value detected by the phase detector 26. The Q-QB duty cycle correction circuit 46 corrects the duty cycles of the Q-clock signal QCLK_E and the QB-clock signal QBCLK_E according to the code values set by the N-bit code counter 44. The Q-clock signal QCLK_DC and the QB-clock signal QBCLK_DC, whose duty cycles are corrected by the Q-QB duty cycle correction circuit 46, are fed back to the phase detector 26. The Q-clock signal QCLK_E and the QB-clock signal QBCLK_E input to the Q-QB duty cycle correction circuit 46 are clock signals that are generated using an external reference clock signal by a clock generator (not shown).

The phase error correction circuit 16 includes an N-bit code counter 48 and a I-Q phase error correction circuit 50. The N-bit code counter 48 sets code values by increasing or decreasing the code values according to the high/low value detected by the phase detector 32. The I-Q phase error correction circuit 50 corrects the phases of the I-clock signal ICLK_DC and the Q-clock signal QCLK_DC according to the code values set by the N-bit code counter 48. The I-clock signal ICLK_PC and the Q-clock signal QCLK_PC, whose phases are corrected by the I-Q phase error correction circuit 50, are fed back to the phase detector 32. The I-clock signal ICLK_DC and the Q-clock signal QCLK_DC input to the I-Q phase error correction circuit 50 are clock signals, whose duty cycles are corrected by the duty cycle correction circuits 42 and 46, respectively. The QPC controller 10 generates enable signals for controlling the operations of the phase detectors 20, 26 and 32, the duty cycle correction circuits 42 and 46, and the phase error correction circuit 50, and the strobe signals to the phase detectors 20, 26 and 32.

The operation of the conventional quadrature phase correction circuit will be described below.

FIG. 2 is a timing diagram illustrating the operations of the respective units included in the conventional quadrature phase correction circuit.

The I-clock signal and the offset values of the components are adjusted by the ICC circuit 22 in the initial operation. To this end, the phase detector 20 receives the I-clock signal and the regulated I-clock signal (first reference signal) and detects the phase difference of the two signals. In this case, the phase detector 20 compares the I-clock signal with the regulated I-clock signal (first reference signal) when the strobe signal output from the QPC controller 10 is at a high level or a low level. The phase detector 20 outputs the high signal when the I-clock signal is greater than the regulated I-clock signal (first reference signal), and outputs the low signal when the I-clock signal is less than the regulated I-clock signal (first reference signal). The first reference signal is a reference value that is separately input for initial code setting.

The N-bit code counter 24 resets the code value by increasing the previously stored code value by 1 when the phase detector 20 outputs the high value, and by decreasing the previously stored code value by 1 when the phase detector 20 outputs the low value. The ICC circuit 22 controls the offset value of the phase detector 20 according to the code value reset to the N-bit code counter 24. Generally, the ICC circuit for controlling the offset value of the phase detector 20 includes a plurality of units that differently control the offset value of the phase detector 20 according to the code values, and the offset value corresponding to the reset code value is set to the phase detector.

Likewise, the Q-clock signal and the offset values of the components are adjusted by the ICC circuit 28 in the initial operation. To this end, the phase detector 26 receives the Q-clock signal and the regulated Q-clock signal (second reference signal) and detects the phase difference of the two signals. In this case, the phase detector 26 compares the Q-clock signal with the regulated Q-clock signal (second reference signal) when the strobe signal output from the QPC controller 10 is at a high or low level. The phase detector 26 outputs the high signal when the Q-clock signal is greater than the regulated Q-clock signal (second reference signal), and outputs the low signal when the Q-clock signal is less than the regulated Q-clock signal (second reference signal). The second reference signal is a reference value that is separately input for initial code setting.

The N-bit code counter 30 resets the code value by increasing the previously stored code value by 1 when the phase detector 26 outputs the high value, and by decreasing the previously stored code value by 1 when the phase detector 26 outputs the low value. The ICC circuit 28 controls the offset value of the phase detector 26 according to the code value reset to the N-bit code counter 30. Generally, the ICC circuit for controlling the offset value of the phase detector 26 includes a plurality of units that differently control the offset value of the phase detector 26 according to the code values, and the offset value corresponding to the reset code value is set to the phase detector.

Furthermore, the I-clock signal (or the Q-clock signal) and the offset values of the components are adjusted by the ICC circuit 32 in the initial operation. To this end, the phase detector 32 receives the I-clock signal (or the Q-clock signal) and a third reference signal and detects the phase difference of the two signals. In this case, the phase detector 32 compares the I-clock signal with the third reference signal when the strobe signal output from the QPC controller 10 is at a high or low level. The phase detector 32 outputs the high signal when the I-clock signal is greater than the third reference signal, and outputs the low signal when the I-clock signal is less than the third reference signal. The third reference signal is a reference value that is separately input for initial code setting.

The N-bit code counter 36 resets the code value by increasing the previously stored code value by 1 when the phase detector 32 outputs the high value, and by decreasing the previously stored code value by 1 when the phase detector 32 outputs the low value. The ICC circuit 34 controls the offset value of the phase detector 32 according to the code value reset to the N-bit code counter 36. Generally, the ICC circuit for controlling the offset value of the phase detector 32 includes a plurality of units that differently control the offset value of the phase detector 32 according to the code values, and the offset value corresponding to the reset code value is set to the phase detector.

Through the above-described processes, the offset of the phase detector 20 is adjusted by the control value of the ICC circuit 22, and the offset of the phase detector 26 is adjusted by the control value of the ICC circuit 28. Also, the offset of the phase detector 32 is adjusted by the control value of the ICC circuit 34. At this point, the initial code control values are set and stored in the corresponding N-bit code counters 24, 30 and 36.

After adjusting the initial code value, the phase detection operations of the phase detectors 20, 26 and 32 and the operations of the duty cycle correction circuits 42 and 46 and the phase error correction circuit 50 are controlled by the control signals provided from the QPC controller 10.

That is, the QPC controller 10 generates the enable signals ICC_IDCDEN, ICC_QDCDEN and ICC_QPDDEN for controlling the operations of the phase detectors 20, 26 and 32. Although not illustrated, the QPC controller 10 generates the strobe signals which will be output to the respective phase detectors.

The phase detector 20 is operated in response to the enable signal ICC_IDCDEN output from the QPC controller 10, and compares the I-clock signal and the IB-clock signal when the strobe signal is at the high level or the low level. The I-clock signal ICLK_DC and the IB-clock signal IBCLK_DC are feedback signals output from the I-IB duty cycle correction circuit 42, which will be described later. The phase detector 20 outputs the high signal when the I-clock signal ICLK_DC is greater than the IB-clock signal IBCLK_DC, and outputs the low signal when the I-clock signal ICLK_DC is less than the IB-clock signal IBCLK_DC.

The N-bit code counter 40 resets the code value by increasing the previously stored code value by 1 when the phase detector 20 outputs the high signal, and by decreasing the previously stored value by 1 when the phase detector 10 outputs the low signal.

The I-IB duty cycle correction circuit 42 is operated in response to the enable signal IDCCEN output from the QPC controller 10 and corrects the duty cycles of the I-clock signal ICLK_E and the IB-clock signal IBCLK_E according to the code value reset to the N-bit code counter 40. Generally, the duty cycle correction of the duty cycle correction circuit 42 is achieved by providing a plurality of units that differently control the duty cycle of the output signal of the duty cycle correction circuit 42 according to the code values, and setting the duty cycle value corresponding to the reset code value to the duty cycle correction circuit 42.

Likewise, the phase detector 26 is operated in response to the enable signal ICC_QDCDEN output from the QPC controller 10, and compares the Q-clock signal QCLK_DC and the QB-clock signal QBCLK_DC when the strobe signal is at the high level or the low level. The Q-clock signal QCLK_DC and the QB-clock signal QBCLK_DC are feedback signals output from the Q-QB duty cycle correction circuit 46, which will be described later. The phase detector 26 outputs the high signal when the Q-clock signal QCLK_DC is greater than the QB-clock signal QBCLK_DC, and outputs the low signal when the Q-clock signal QCLK_DC is less than the QB-clock signal QBCLK_DC.

The N-bit code counter 44 resets the code value by increasing the previously stored code value by 1 when the phase detector 26 outputs the high signal, and by decreasing the previously stored value by 1 when the phase detector 26 outputs the low signal.

The Q-QB duty cycle correction circuit 46 is operated in response to the enable signal QDCCEN output from the QPC controller 10 and corrects the duty cycles of the Q-clock signal QCLK_E and the QB-clock signal QBCLK_E according to the code value reset to the N-bit code counter 44. Generally, the duty cycle correction of the duty cycle correction circuit 46 is achieved by providing a plurality of units that differently control the duty cycle of the output signal of the duty cycle correction circuit 46 according to the code values, and setting the duty cycle value corresponding to the reset code value to the duty cycle correction circuit 46.

The phase detector 32 is operated in response to the enable signal ICC_QPDDEN output from the QPC controller 10, and compares the I-clock signal ICLK_PC and the Q-clock signal QCLK_PC when the strobe signal is at the high level or the low level. The I-clock signal ICLK_PC and the Q-clock signal QCLK_PC are feedback signals output from the I-IB/Q-QB duty cycle correction circuits 42 and 46, respectively. The phase detector 32 outputs the high signal when the I-clock signal ICLK_PC is greater than the Q-clock signal QCLK_PC, and outputs the low signal when the I-clock signal ICLK_PC is less than the Q-clock signal QCLK_PC.

The N-bit code counter 48 resets the code value by increasing the previously stored code value by 1 when the phase detector 32 outputs the high signal, and by decreasing the previously stored value by 1 when the phase detector 32 outputs the low signal.

The I-Q phase error correction circuit 50 is operated in response to the enable signal QPCEN output from the QPC controller 10 and corrects the phases of the I-clock signal ICLK_DC and the Q-clock signal QCLK_DC according to the code value reset to the N-bit code counter 48. Generally, the phase correction of the I-Q phase error correction circuit 50 is achieved by providing a plurality of units that differently control the phase correction of the I-clock signal and the Q-clock signal output from the phase error correction circuit 50 according to the code values, and setting the phase correction value corresponding to the reset code value to the phase error correction circuit 50.

Through the above-described processes, the duty cycle correction value of the I-IB duty cycle correction circuit 42 is set based on the code value set by the N-bit code counter 40, and the duty cycle correction value of the Q-QB duty cycle correction circuit 46 is set based on the code value set by the N-bit code counter 44. The phase correction value of the I-Q phase error correction circuit 50 is set based on the code value set by the N-bit code counter 48.

The conventional quadrature phase correction circuit includes the N-bit code counters 24, 30 and 36 in order to set the initial code values of the phase detectors 20, 26 and 32. Specifically, the initial code values of the phase detectors 20, 26 and 32 are set based on the values set and stored in the N-bit code counters 24, 30 and 36. In addition, the phase differences detected by the phase detectors 20, 26 and 32 are set and stored in the N-bit code counters 40, 44 and 48. Furthermore, the code values for the duty cycle correction values of the duty cycle correction circuits 42 and 46 and the phase correction value of the phase error correction circuit 50 are set.

Therefore, the conventional quadrature phase correction circuit needs a total of six code counters in order to correct the phases of the I-clock signal and the Q-clock signal. However, since the six code counters occupy a large area, there is a difficulty in the fabrication of the semiconductor devices.

SUMMARY OF THE INVENTION

Embodiments of the present invention are directed to providing a quadrature phase correction circuit, which is capable of reducing a layout size by decreasing the number of code counters.

In accordance with an aspect of the present invention, there is provided a quadrature phase correction circuit, including: an N-bit code counter configured to generate an N-bit code value according to a detected phase difference when a quadrature phase correction is carried out; a storage configured to store N-bit code values according to a plurality of detected phase differences; and a controller configured to share the N-bit code counter, control the generation of the N-bit code values according to the plurality of detected phase differences, and control the storing of the N-bit code values in an allocated space of the storage.

In accordance with another aspect of the present invention, there is provided a quadrature phase correction circuit, including: a phase detector configured to detect a phase difference with respect to an input signal in order for quadrature phase correction; a storage controller configured to share one N-bit code counter, control the generation of N-bit code values according to a plurality of detected phase differences, and control the storing of the generated N-bit code values in an allocated space of the storage; a duty cycle corrector configured to control a duty cycle correction with respect to the detected phase difference by applying one of the N-bit code values stored in the storage controller; and a quadrature phase error corrector configured to correct a phase difference with respect to the duty-cycle-corrected signal by applying one of the N-bit code values stored in the storage controller.

DESCRIPTION OF SPECIFIC EMBODIMENTS

Hereinafter, a quadrature phase correction circuit in accordance with the present invention will be described in detail with reference to the accompanying drawing.

Figure 1:
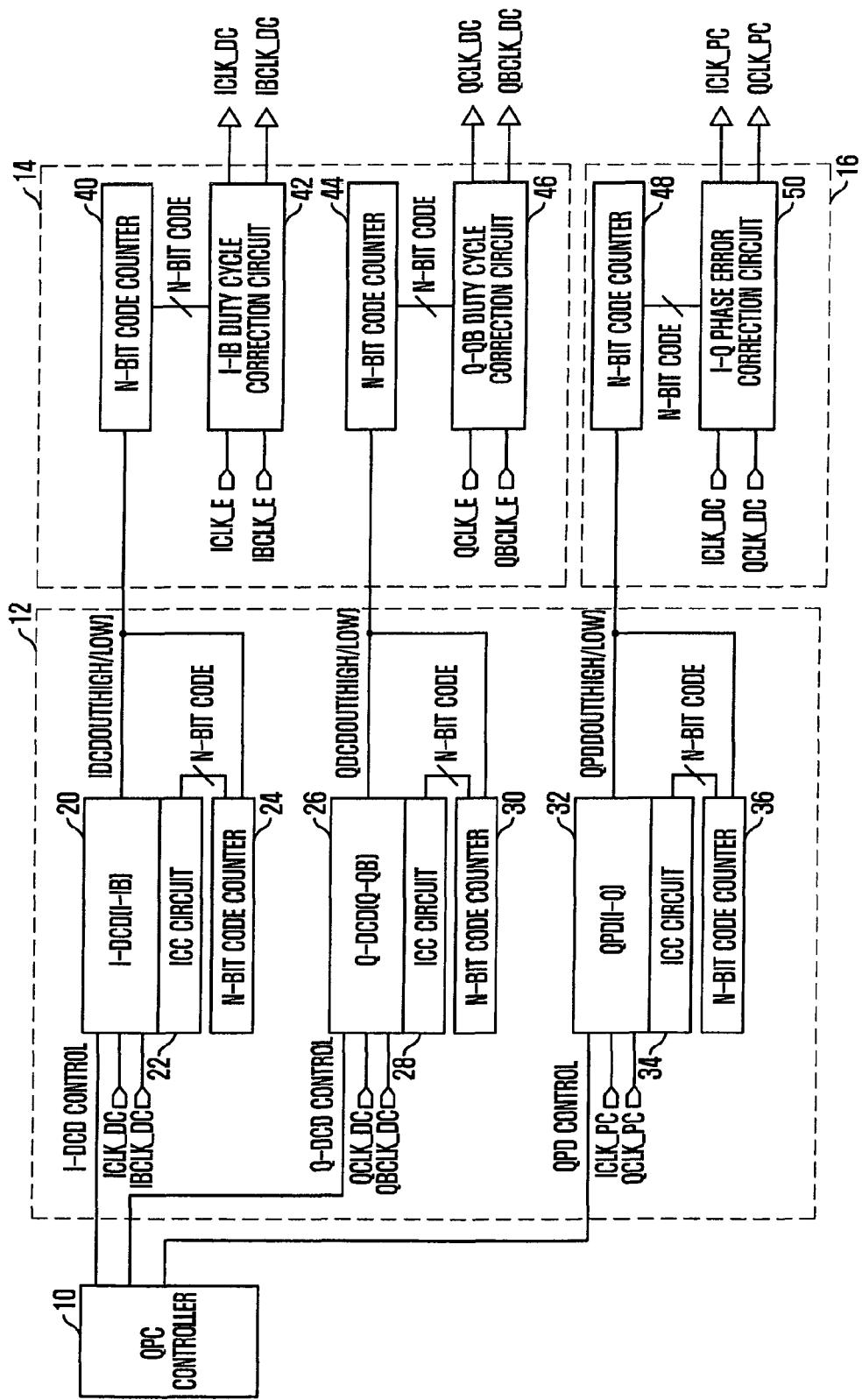
FIG. 1 is a block diagram of a conventional quadrature phase correction circuit.
Figure 2:
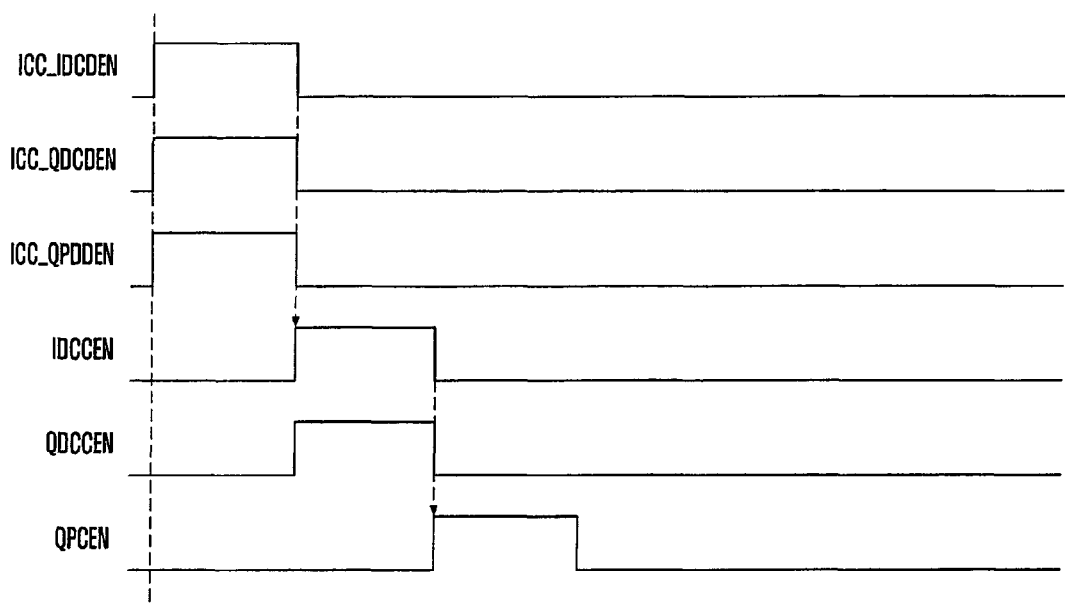
FIG. 2 is a timing diagram illustrating the operations of the respective units included in the conventional quadrature phase correction circuit.
Figure 3:
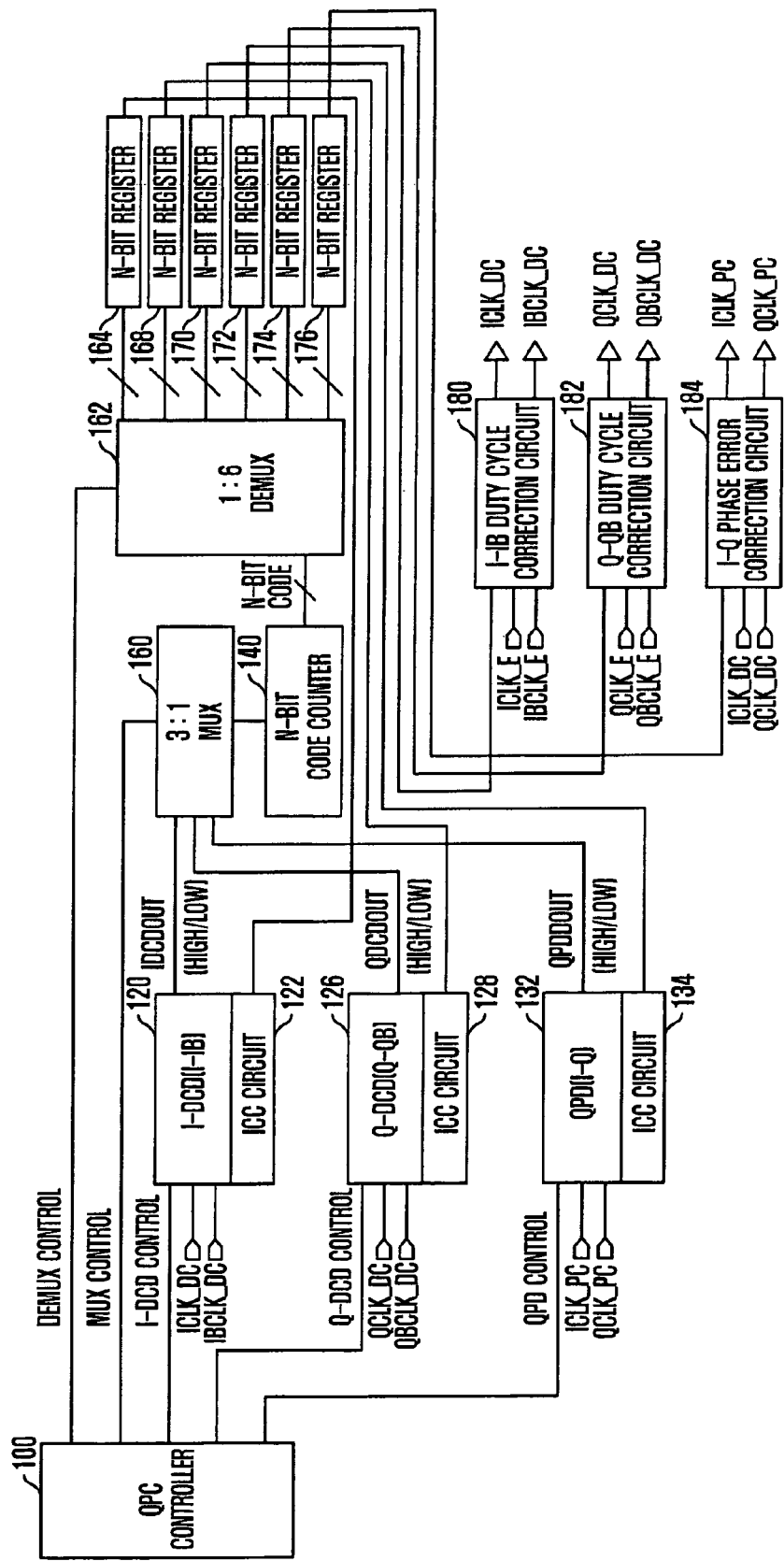
FIG. 3 is a block diagram of a quadrature phase correction circuit in accordance with an embodiment of the present invention.

FIG. 3 is a block diagram of a quadrature phase correction circuit in accordance with an embodiment of the present invention.

Referring to FIG. 3, the quadrature phase correction circuit includes a quadrature phase correction control circuit, a phase detection circuit, a duty cycle correction circuit, and a phase error correction circuit. The phase detection circuit detects phases of in-phase (I) and quadrature (Q) clock signals fed back. The duty cycle correction circuit corrects duty cycles of the I-clock signal and the Q-clock signal according to the phase difference detected by the phase detection circuit. The phase error correction circuit corrects the phase error of the I-clock signal and the Q-clock signal whose duty cycles are corrected by the duty cycle correction circuit. In addition, the quadrature phase correction circuit further includes a storage control circuit storing initial code values of the phase detectors, duty cycle correction values, and phase correction values.

The phase detection circuit includes an initial code control (ICC) circuit 122 and a phase detector (I-DCD(I-IB)) 120. The ICC circuit 122 performs an initial code control according to the code values for correcting I-clock signal and offset values of components in an initial operation. The phase detector 120 receives the I-clock signal ICLK_DC and the IB-clock signal IBCLK_DC (an inversion signal of the I-clock signal) fed back after the offset value is adjusted by the ICC circuit 122, and generates a high signal or a low signal according to the phase detection. The initial code value for the offset control of the ICC circuit 122 is based on a value stored in an N-bit register 164, which will be described later.

The phase detector 120 compares a phase of the I-clock signal ICLK_DC with a phase of the IB-clock signal IBCLK_DC when a strobe signal (not shown) applied from a quadrature phase correction (QPC) controller 100 is at a high level or a low level. The phase detector 120 generates the high signal when the phase of the I-clock signal ICLK_DC is greater than that of the IB-clock signal IBCLK_DC, and generates the low signal when the phase of the I-clock signal ICLK_DC is less than that of the IB-clock signal IBCLK_DC.

In addition, the phase detection circuit includes an ICC circuit 128 and a phase detector (Q-DCD(Q-QB)) 126. The ICC circuit 128 performs an initial code control according to the code values for correcting Q-clock signal and offset values of components in an initial operation. The phase detector 126 receives the Q-clock signal QCLK_DC and the QB-clock signal QBCLK_DC (an inversion signal of the Q-clock signal) fed back after the offset value is adjusted by the ICC circuit 128, and generates a high signal or a low signal according to the phase detection. The initial code value for the offset control of the ICC circuit 128 is based on a value stored in an N-bit register 168, which will be described later.

The phase detector 126 compares a phase of the Q-clock signal QCLK_DC with a phase of the QB-clock signal QBCLK_DC when a strobe signal (not shown) applied from the QPC controller 100 is at a high level or a low level. The phase detector 126 generates the high signal when the phase of the Q-clock signal QCLK_DC is greater than that of the QB-clock signal QBCLK_DC, and generates the low signal when the phase of the Q-clock signal QCLK_DC is less than that of the QB-clock signal QBCLK_DC.

Furthermore, the phase detection circuit includes an ICC circuit 134 and a phase detector (QPD(I-Q)) 132. The ICC circuit 134 performs an initial code control according to the code values for correcting I-clock signal and Q-clock signal, whose duty cycles are corrected, and offset values of components in an initial operation. The phase detector 132 receives the I-clock signal ICLK_PC and the Q-clock signal QCLK_PC fed back after the offset value is adjusted by the ICC circuit 134, and generates a high signal or a low signal according to the phase detection. The initial code value for the offset control of the ICC circuit 134 is based on a value stored in an N-bit register 170, which will be described later.

The phase detector 132 compares a phase of the I-clock signal ICLK_PC with a phase of the Q-clock signal QCLK_PC when a strobe signal (not shown) applied from the QPC controller 100 is at a high level or a low level. The phase detector 132 generates the high signal when the phase of the I-clock signal ICLK_PC is greater than that of the Q-clock signal QCLK_PC, and generates the low signal when the phase of the I-clock signal ICLK_PC is less than that of the Q-clock signal QCLK_PC.

The storage control circuit stores the initial code values of the phase detectors, the duty cycle correction values, and the phase correction values. The storage control circuit includes the N-bit register 164 storing the initial code value of the phase detector 120, the N-bit register 168 storing the initial code value of the phase detector 126, and the N-bit register 170 storing the initial code value of the phase detector 132. In addition, the storage control circuit includes an N-bit register 172 storing the code value according to the I/IB phase difference detected by the phase detector 120, an N-bit register 174 storing the code value according to the Q/QB phase difference detected by the phase detector 126, and an N-bit register 176 storing the code value according to the I/Q phase difference detected by the phase detector 132.

Furthermore, the storage control circuit includes a multiplexer 160 for selecting one of the output signals of the three phase detectors 120, 126 and 132, an N-bit code counter 140 for converting an output signal of the multiplexer 160 into an analog signal, and a demultiplexer 162 for selectively storing an output signal of the N-bit code counter 140 in the six registers.

The duty cycle correction circuit includes an I-IB duty cycle correction circuit 180 for correcting the duty cycles of the I-clock signal and the IB-clock signal according to the code value set in the N-bit code counter 172. The I-clock signal ICLK_DC and the IB-clock signal IBCLK_DC, whose duty cycles are corrected by the I-IB duty cycle correction circuit 180, are fed back to the phase detector 120. The I-clock signal ICLK_E and the IB-clock signal IBCLK_E input to the I-IB duty cycle correction circuit 180 are clock signals that are generated using an external reference clock signal by a clock generator (not shown).

In addition, the duty cycle correction circuit includes a Q-QB duty cycle correction circuit 182 for correcting the duty cycles of the Q-clock signal and the QB-clock signal according to the code value set in the N-bit code counter 174. The Q-clock signal QCLK_DC and the QB-clock signal QBCLK_DC, whose duty cycles are corrected by the Q-QB duty cycle correction circuit 182, are fed back to the phase detector 126. The Q-clock signal QCLK_E and the QB-clock signal QBCLK_E input to the Q-QB duty cycle correction circuit 182 are clock signals that are generated using an external reference clock signal by a clock generator (not shown).

The phase error correction circuit includes an I-Q phase error correction circuit 184 for correcting the phases of the I-clock signal and the Q-clock signal according to the code value set in the N-bit code counter 176. The I-clock signal ICLK_PC and the Q-clock signal QCLK_PC, whose phases are corrected by the I-Q phase error correction circuit 184, are fed back to the phase detector 132. The I-clock signal ICLK_DC and the Q-clock signal QCLK_DC input to the I-Q phase error correction circuit 184 are clock signals whose duty cycles are corrected by the duty cycle correction circuits 180 and 182, respectively.

The QPC controller 100 generates enable signals for controlling the operations of the phase detectors 120, 126 and 132, the duty cycle correction circuits 180 and 182, and the phase error correction circuit 184, and strobe signals to be provided to the phase detectors 120, 126 and 132. In addition, the QPC controller 100 generates control signals for controlling the operations of the multiplexer 160 and the demultiplexer 162.

The operation of the quadrature phase correction circuit in accordance with the embodiment of the present invention will be described below.

Figure 4:
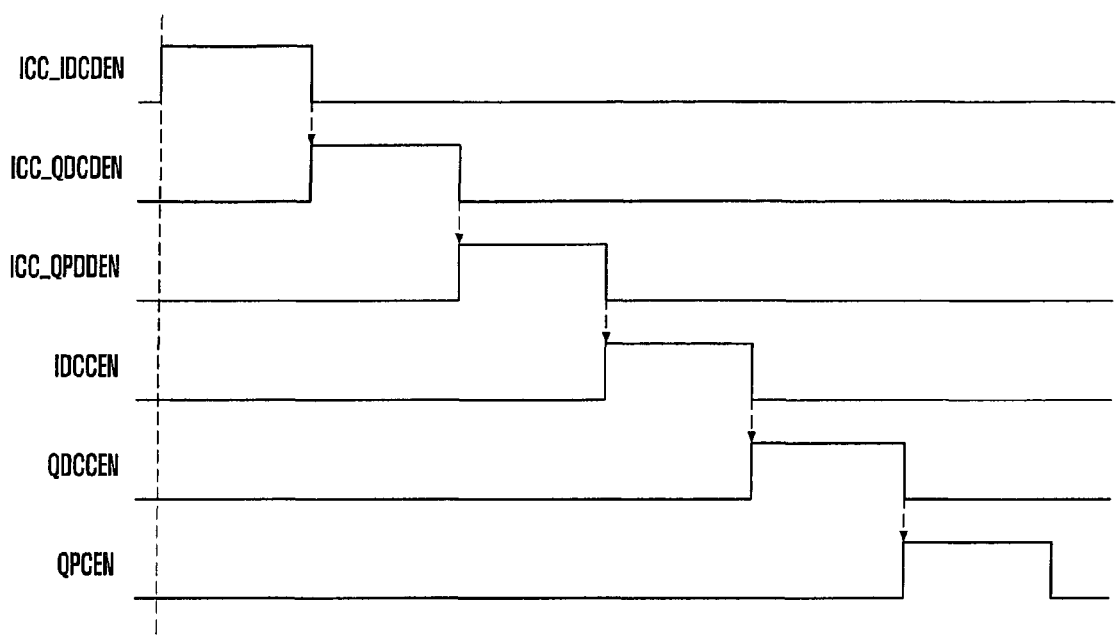
FIG. 4 is a timing diagram illustrating the operations of the respective units included in the quadrature phase correction circuit in accordance with the embodiment of the present invention.

FIG. 4 is a timing diagram illustrating the operations of the respective units included in the quadrature phase correction circuit in accordance with the embodiment of the present invention.

The I-clock signal and the offset values of the components are adjusted by the ICC circuit 122 in the initial operation. To this end, the phase detector 120 receives the I-clock signal and the regulated I-clock signal (first reference signal) and detects the phase difference of the two signals. In this case, the phase detector 120 compares the I-clock signal with the regulated I-clock signal (first reference signal) when the strobe signal output from the QPC controller 100 is at a high or low level. The phase detector 120 outputs the high signal when the I-clock signal is greater than the regulated I-clock signal (first reference signal), and outputs the low signal when the I-clock signal is less than the regulated I-clock signal (first reference signal). The first reference signal is a reference value that is separately input for initial code setting.

The N-bit code counter 140 resets the code value by increasing the previously stored code value by 1 when the phase detector 120 outputs the high value, and by decreasing the previously stored code value by 1 when the phase detector 120 outputs the low value. In order to set the output value of the phase detector 120 in the N-bit code counter 140, the ICC circuit 100 controls the multiplexer 160 and the demultiplexer 162. That is, the multiplexer 160 is controlled to select the output signal of the phase detector 120 and output the selected output signal to the N-bit code counter 140, and the demultiplexer 162 is controlled to store the output signal of the N-bit code counter 140 in the N-bit register 164.

The ICC circuit 122 controls the offset value of the phase detector 120 according to the code value reset to the N-bit register 164. Generally, the ICC circuit for controlling the offset value of the phase detector 120 includes a plurality of units that differently control the offset value of the phase detector 120 according to the code values, and the offset value corresponding to the reset code value is set to the phase detector 120.

The Q-clock signal and the offset values of the components are adjusted by the ICC circuit 128 in the initial operation. To this end, the phase detector 126 receives the Q-clock signal and the regulated Q-clock signal (second reference signal) and detects the phase difference of the two signals. In this case, the phase detector 126 compares the Q-clock signal with the regulated Q-clock signal (second reference signal) when the strobe signal output from the QPC controller 100 is at a high or low level. The phase detector 126 outputs the high signal when the Q-clock signal is greater than the regulated Q-clock signal (second reference signal), and outputs the low signal when the Q-clock signal is less than the regulated Q-clock signal (second reference signal). The second reference signal is a reference value that is separately input for initial code setting.

The N-bit code counter 140 resets the code value by increasing the previously stored code value by 1 when the phase detector 126 outputs the high value, and by decreasing the previously stored code value by 1 when the phase detector 126 outputs the low value. In order to set the output value of the phase detector 126 in the N-bit code counter 140, the ICC circuit 100 controls the multiplexer 160 and the demultiplexer 162. That is, the multiplexer 160 is controlled to select the output signal of the phase detector 126 and output the selected output signal to the N-bit code counter 140, and the demultiplexer 162 is controlled to store the output signal of the N-bit code counter 140 in the N-bit register 168.

The ICC circuit 128 controls the offset value of the phase detector 126 according to the code value reset to the N-bit register 168. Generally, the ICC circuit for controlling the offset value of the phase detector 126 includes a plurality of units that differently control the offset value of the phase detector 126 according to the code values, and the offset value corresponding to the reset code value is set to the phase detector 126.

In order for initial code control of the phase detector 132, the I-clock signal (or the Q-clock signal) and the offset values of the components are adjusted by the ICC circuit 134 in the initial operation. To this end, the phase detector 132 receives the I-clock signal (or the Q-clock signal) and a third reference signal and detects the phase difference of the two signals. In this case, the phase detector 132 compares the I-clock signal with the third reference signal when the strobe signal output from the QPC controller 100 is at a high or low level. The phase detector 132 outputs the high signal when the I-clock signal is greater than the third reference signal, and outputs the low signal when the I-clock signal is less than the third reference signal. The third reference signal is a reference value that is separately input for initial code setting.

The N-bit code counter 140 resets the code value by increasing the previously stored code value by 1 when the phase detector 132 outputs the high value, and by decreasing the previously stored code value by 1 when the phase detector 132 outputs the low value. In order to set the output value of the phase detector 132 in the N-bit code counter 140, the ICC circuit 100 controls the multiplexer 160 and the demultiplexer 162. That is, the multiplexer 160 is controlled to select the output signal of the phase detector 132 and output the selected output signal to the N-bit code counter 140, and the demultiplexer 162 is controlled to store the output signal of the N-bit code counter 140 in the N-bit register 170.

The ICC circuit 134 controls the offset value of the phase detector 132 according to the code value reset to the N-bit register 170. Generally, the ICC circuit for controlling the offset value of the phase detector 132 includes a plurality of units that differently control the offset value of the phase detector 132 according to the code values, and the offset value corresponding to the reset code value is set to the phase detector 132.

Through the above-described processes, the offset of the phase detector 120 is adjusted by the control value of the ICC circuit 122, and the offset of the phase detector 126 is adjusted by the control value of the ICC circuit 128. Also, the offset of the phase detector 132 is adjusted by the control value of the ICC circuit 134. At this point, the initial code control values are set and stored in the N-bit registers 164, 168 and 170.

After adjusting the initial code values, the phase detection operations of the respective phase detectors 120, 126 and 132 are controlled based on the control signals provided from the QPC controller 100. That is, the QPC controller 100 sequentially generates the enable signals for controlling the operations of the respective phase detectors 120, 126 and 132. Although not illustrated, the QPC controller 100 generates the strobe signals that will be provided to the respective phase detectors.

The QPC controller 100 outputs the enable signal for controlling the operation of the phase detector 120, which controls the storing of the code value based on the I/IB phase difference in the N-bit register 172. That is, the QPC controller 100 outputs the enable signal ICC_IDCDEN of FIG. 4 to enable the phase detector 120. In addition, the QPC controller 100 outputs the control signal to the multiplexer 160 to select the output signal of the phase detector 120. The QPC controller 100 outputs the control signal to the demultiplexer 162 to store the output signal of the N-bit code counter 140 in the N-bit register 172.

Therefore, the phase detector 120 is operated by the enable signal ICC_IDCDEN output from the QPC controller 100, and compares the I-clock signal ICLK_DC and the IB-clock signal IBCLK_DC when the strobe signal is at the high level or the low level. The I-clock signal ICLK_DC and the IB-clock signal IBCLK_DC are feedback signals output from the I-IB duty cycle correction circuit 180, which will be described later. The phase detector 120 outputs the high signal when the I-clock signal ICLK_DC is greater than the IB-clock signal IBCLK_DC, and outputs the low signal when the I-clock signal ICLK_DC is less than the IB-clock signal IBCLK_DC.

The high signal output from the phase detector 120 is provided to the N-bit code counter 140 through the multiplexer 160. The N-bit code counter 140 resets the code value by increasing the previously stored code value by 1 when the phase detector 120 outputs the high signal, and by decreasing the previously stored code value by 1 when the phase detector 120 outputs the low signal. The code value reset by the N-bit code counter 140 is stored in the N-bit register 172 through the demultiplexer 162.

After finishing the code value setting of the N-bit register 172 according to the I/IB phase value detection of the phase detector 120, the QPC controller 100 controls the code value setting according to the Q/QB phase value detection of the phase detector 126.

The QPC controller 100 outputs the enable signal for controlling the operation of the phase detector 126, which controls the storing of the code value based on the Q/QB phase difference in the N-bit register 174. That is, the QPC controller 100 outputs the enable signal ICC_QDCDEN of FIG. 4 to enable the phase detector 126. In addition, the QPC controller 100 outputs the control signal to the multiplexer 160 to select the output signal of the phase detector 126. The QPC controller 100 outputs the control signal to the demultiplexer 162 to store the output signal of the N-bit code counter 140 in the N-bit register 174.

Therefore, the phase detector 126 is operated by the enable signal ICC_QDCDEN output from the QPC controller 100, and compares the Q-clock signal QCLK_DC and the QB-clock signal QBCLK_DC when the strobe signal is at the high level or the low level. The Q-clock signal QCLK_DC and the QB-clock signal QBCLK_DC are feedback signals output from the Q-QB duty cycle correction circuit 182, which will be described later. The phase detector 126 outputs the high signal when the Q-clock signal QCLK_DC is greater than the QB-clock signal QBCLK_DC, and outputs the low signal when the Q-clock signal QCLK_DC is less than the QB-clock signal QBCLK_DC.

The high signal output from the phase detector 126 is provided to the N-bit code counter 140 through the multiplexer 160. The N-bit code counter 140 resets the code value by increasing the previously stored code value by 1 when the phase detector 126 outputs the high signal, and by decreasing the previously stored code value by 1 when the phase detector 126 outputs the low signal. The code value reset by the N-bit code counter 140 is stored in the N-bit register 174 through the demultiplexer 162.

After finishing the code value setting of the N-bit register 174 according to the Q/QB phase value detection of the phase detector 126, the QPC controller 100 controls the code value setting according to the I/Q phase value detection of the phase detector 132.

The QPC controller 100 outputs the enable signal for controlling the operation of the phase detector 132, which controls the storing of the code value based on the I/Q phase difference in the N-bit register 176. That is, the QPC controller 100 outputs the enable signal ICC_QPDDEN of FIG. 4 to enable the phase detector 132. In addition, the QPC controller 100 outputs the control signal to the multiplexer 160 to select the output signal of the phase detector 132. The QPC controller 100 outputs the control signal to the demultiplexer 162 to store the output signal of the N-bit code counter 140 in the N-bit register 176.

Therefore, the phase detector 132 is operated by the enable signal ICC_QPDDEN output from the QPC controller 100, and compares the I-clock signal ICLK_PC and the Q-clock signal QCLK_PC when the strobe signal is at the high level or the low level. The I-clock signal ICLK_PC and the Q-clock signal QCLK_PC are feedback signals output from the I-IB/Q-QB duty cycle correction circuits 180 and 182, respectively. The phase detector 132 outputs the high signal when the I-clock signal ICLK_PC is greater than the Q-clock signal QCLK_PC, and outputs the low signal when the I-clock signal ICLK_PC is less than the Q-clock signal QCLK_PC.

The high signal output from the phase detector 132 is provided to the N-bit code counter 140 through the multiplexer 160. The N-bit code counter 140 resets the code value by increasing the previously stored code value by 1 when the phase detector 132 outputs the high signal, and by decreasing the previously stored code value by 1 when the phase detector 132 outputs the low signal. The code value reset by the N-bit code counter 140 is stored in the N-bit register 176 through the demultiplexer 162.

In this way, the code value according to the I/IB phase difference detected by the phase detector 120 is stored in the N-bit register 172, and the code value according to the Q/QB phase difference detected by the phase detector 126 is stored in the N-bit register 174. Also, the code value according to the I/Q phase difference detected by the phase detector 132 is stored in the N-bit register 176.

After adjusting the code value according to the phase difference, the operations of the duty cycle correction circuits 180 and 182 and the phase error correction circuit 184 are controlled based on the control signals provided from the QPC controller 100. To this end, the QPC controller 100 sequentially outputs the enable signals for controlling the operation of the respective correction circuits.

First, the QPC controller 100 controls the operation of the I-IB duty cycle correction circuit 180. That is, the I-IB duty cycle correction circuit 180 is operated by the enable signal IDCCEN of FIG. 4 output from the QPC controller 100, and corrects the duty cycles of the I-clock signal ICLK_E and the IB-clock signal IBCLK_E according to the code values reset in the N-bit register 172. Generally, the duty cycle correction circuit 180 includes a plurality of units that differently control the duty cycle values of the duty cycle correction circuit 180 according to the code values, and the duty cycle value corresponding to the reset code value is set to the duty cycle correction circuit 180.

In addition, the QPC controller 100 controls the operation of the Q-QB duty cycle correction circuit 182. That is, the Q-QB duty cycle correction circuit 182 is operated by the enable signal QDCCEN of FIG. 4 output from the QPC controller 100, and corrects the duty cycles of the Q-clock signal QCLK_E and the QB-clock signal QBCLK_E according to the code values reset in the N-bit register 174. Generally, the duty cycle correction circuit 182 includes a plurality of units that differently control the duty cycle values of the duty cycle correction circuit 182 according to the code values, and the duty cycle value corresponding to the reset code value is set to the duty cycle correction circuit 182.

Furthermore, the QPC controller 100 controls the operation of the I-Q phase error correction circuit 184. That is, the I-Q phase error correction circuit 184 is operated by the enable signal QPCEN of FIG. 4 output from the QPC controller 100, and corrects the phases of the I-clock signal ICLK_DC and the Q-clock signal QCLK_DC according to the code values reset in the N-bit register 176. Generally, for the duty cycle value control of the phase error correction circuit 176, the phase error correction circuit 176 includes a plurality of units that differently control the phase correction values of the I-clock signal and the Q-clock signal according to the code values, and the phase correction value corresponding to the reset code value is set to the phase error correction circuit 176.

In this way, the duty cycle correction value of the I-IB duty cycle correction circuit 180 is set based on the code value set in the N-bit register 172, and the duty cycle correction value of the Q-QB duty cycle correction circuit 182 is set based on the code value set in the N-bit register 174. Also, the phase correction value of the I-Q phase error correction circuit 176 is set based on the code value set in the N-bit register 176. The above-described operations are sequentially controlled by the control signals output from the QPC controller 100.

From the timing diagram of FIG. 4, after sequentially controlling the phase detector 120 for detecting the phase difference of the I/IB signals, the phase detector 126 for detecting the phase difference of the Q/QB signals, and the phase detector 132 for detecting the phase difference of the I/Q signals, the operations of the duty cycle correction circuits 180 and 182 and the phase error correction circuit 184 are sequentially controlled. However, the operation order can be changed under control of the QPC controller 100.

Furthermore, although the ICC circuits for controlling the initial offset values of the phase detectors and the N-bit registers for storing the initial code values are provided, they may be omitted when the control of the initial offset values is unnecessary according to characteristics of products.

As described above, the storing of the code values in the six N-bit registers according to the phase difference detection results is controlled using one N-bit code counter, the six N-bit registers, the multiplexer, and the demultiplexer. In the typical quadrature phase correction circuit, one code counter (4-bit counter) occupies more than 10% of the entire area of the quadrature phase correction circuit. However, in accordance with the embodiments of the present invention, the number of the code counters is reduced and the storing of the code values is controlled using the register, the multiplexer, and the demultiplexer, thereby obtaining the area reduction effect of more than 30%. Consequently, the layout size, which is very important in the semiconductor fabrication process, can be reduced.

In accordance with the above-described embodiments, the layout size can be reduced by reducing the number of the code counters in the quadrature phase correction circuit.

While the present invention has been described with respect to the specific embodiment, it will be apparent to those skilled in the art that various changes and modifications may be made without departing from the spirit and scope of the invention as defined in the following claims.

What is claimed is:

1. A quadrature phase correction circuit, comprising:
an N-bit code counter configured to generate an N-bit code value according to a detected phase difference when a quadrature phase correction is carried out;
a storage configured to store N-bit code values according to a plurality of detected phase differences; and
a controller configured to share the N-bit code counter, control the generation of the N-bit code values according to the plurality of detected phase differences, and control the storing of the N-bit code values in an allocated space of the storage,
wherein the controller comprises:
a multiplexer configured to provide the plurality of detected phase differences to the N-bit code counter; and
a demultiplexer configured to store the N-bit code values output from the N-bit code counter in the allocated space of the storage.

2. The quadrature phase correction circuit as recited in claim 1, wherein the storage uses a plurality of N-bit registers.

3. The quadrature phase correction circuit as recited in claim 1, wherein the controller further comprises a quadrature phase correction controller configured to control the operations of the multiplexer and the demultiplexer.

4. A quadrature phase correction circuit, comprising:
a phase detector configured to detect a phase difference with respect to an input signal in order for quadrature phase correction;
a storage controller configured to share one N-bit code counter, control the generation of N-bit code values according to a plurality of detected phase differences, and control the storing of the generated N-bit code values in an allocated space of the storage;
a duty cycle corrector configured to control a duty cycle correction with respect to the detected phase difference by applying one of the N-bit code values stored in the storage controller; and
a quadrature phase error corrector configured to correct a phase difference with respect to the duty-cycle-corrected signal by applying one of the N-bit code values stored in the storage controller, wherein the storage controller comprises
a multiplexer configured to provide the plurality of detected phase difference the N-bit code counter; and
a demultiplexer configured to store the N-bit code values from the N-bit code counter in the allocated spaces of the storage.

5. The quadrature phase correction circuit as recited in claim 4, wherein the storage controller further comprises:
an N-bit code counter configured to generate the N-bit code values according to the phase difference detected by the phase detector; and
a storage configured to store the N-bit code values according to a plurality of phase differences detected by the phase detector in separately allocated spaces.

6. The quadrature phase correction circuit as recited in claim 5, wherein the storage uses a plurality of N-bit registers.

7. The quadrature phase correction circuit as recited in claim 6, wherein the storage comprises:
a first register configured to store one of the N-bit code values according to a phase difference between an I-clock signal and an IB-clock signal, which is an inversion signal of the I-clock signal;
a second register configured to store one of the N-bit code values according to a phase difference between a Q-clock signal and a QB-clock signal, which is an inversion signal of the Q-clock signal; and
a third register configured to store one of the N-bit code values according to a phase difference between the I-clock signal and the Q-clock signal.

8. The quadrature phase correction circuit as recited in claim 5, wherein the storage controller further comprises a quadrature phase correction controller configured to control the operations of the multiplexer and the demultiplexer.

9. The quadrature phase correction circuit as recited in claim 4, wherein the phase detector comprises:
a first phase detector configured to detect a phase difference between an I-clock signal and an IB-clock signal, which is an inversion signal of the I-clock signal;
a second phase detector configured to detect a phase difference between a Q-clock signal and a QB-clock signal, which is an inversion signal of the Q-clock signal; and
a third phase detector configured to detect a phase difference between the I-clock signal and the Q-clock signal.

10. The quadrature phase correction circuit as recited in claim 9, wherein the storage controller further comprises:
one N-bit code counter configured to generate N-bit code values according to phase differences detected by the first, second and third phase detectors; and
a storage configured to store the N-bit code values according to the plurality of phase difference detected by the first, second and third phase detectors in allocated spaces.

11. The quadrature phase correction circuit as recited in claim 10, wherein the storage comprises:
a first register configured to store one of the N-bit code values according to the phase difference between the I-clock signal and the IB-clock signal detected by the first phase detector;
a second register configured to store one of the N-bit code values according to the phase difference between the Q-clock signal and the QB-clock signal detected by the second phase detector; and
a third register configured to store one of the N-bit code values according to the phase difference between the I-clock signal and Q-clock signal detected by the third phase detector.

12. The quadrature phase correction circuit as recited in claim 11, wherein the storage further comprises:
a fourth register configured to store an initial code value for controlling an initial offset value of the first phase detector;
a fifth register configured to store an initial code value for controlling an initial offset value of the second phase detector; and
a sixth register configured to store an initial code value for controlling an initial offset value of the third phase detector.

13. The quadrature phase correction circuit as recited in claim 12, wherein the first, second and third phase detectors perform the offset control by applying the initial code values stored in the fourth, fifth and sixth registers.

14. The quadrature phase correction circuit as recited in claim 10, wherein the storage controller further comprises a quadrature phase correction controller configured to control the operations of the multiplexer and the demultiplexer.

15. The quadrature phase correction circuit as recited in claim 11, wherein the duty cycle corrector comprises:
a first duty cycle correction circuit configured to correct a duty cycle according to the N-bit code value of the first register, which is configured to store the N-bit code value according to the phase difference between the I-clock signal and the IB-clock signal detected by the first phase detector; and
a second duty cycle correction circuit configured to correct a duty cycle according to the code value of the second register, which is configured to store the code value according to the phase difference between the Q-clock signal and the QB-clock signal detected by the second phase detector.

16. The quadrature phase correction circuit as recited in claim 11, wherein the phase error corrector comprises a phase error correction circuit configured to correct a phase according to the N-bit code value of the third register, which is configured to store the N-bit code value according to the phase difference between the I-clock signal and the Q-clock signal detected by the third phase detector.

17. The quadrature phase correction circuit as recited in claim 4, further comprising a quadrature phase correction controller configured to sequentially control the operations of the phase detector, the storage controller, the duty cycle corrector, and the phase error corrector in order for quadrature phase correction.

* * * * *